United States Patent
Sipila et al.

(10) Patent No.: US 8,811,216 B2
(45) Date of Patent: Aug. 19, 2014

(54) APPARATUS AND METHOD FOR CUBIC METRIC COMPUTATION IN DUAL-CARRIER AND MULTI-CARRIER WIRELESS COMMUNICATION SYSTEM

(75) Inventors: Teemu Taneli Sipila, Oulunsalo (FI); Ville Riekkinen, Oulu (FI)

(73) Assignee: Nokia Corporation, Espoo (FI)

( * ) Notice: Subject to any disclaimer, the term of this patent is extended or adjusted under 35 U.S.C. 154(b) by 153 days.

(21) Appl. No.: 13/511,354

(22) PCT Filed: Nov. 17, 2010

(86) PCT No.: PCT/IB2010/055235
§ 371 (c)(1),
(2), (4) Date: May 22, 2012

(87) PCT Pub. No.: WO2011/070460
PCT Pub. Date: Jun. 16, 2011

(65) Prior Publication Data
US 2012/0275330 A1    Nov. 1, 2012

Related U.S. Application Data

(60) Provisional application No. 61/285,333, filed on Dec. 10, 2009.

(51) Int. Cl.
| | |
|---|---|
| *G06F 11/00* | (2006.01) |
| *H04J 1/16* | (2006.01) |
| *H04L 1/00* | (2006.01) |
| *H04L 12/26* | (2006.01) |
| *H04W 52/42* | (2009.01) |
| *H04W 52/16* | (2009.01) |
| *H03G 3/30* | (2006.01) |

(52) U.S. Cl.
CPC .............. *H04W 52/42* (2013.01); *H04W 52/16* (2013.01); *H03G 3/3042* (2013.01)
USPC ........................... 370/252; 370/254; 370/253

(58) Field of Classification Search
CPC ..... H04L 47/10; H04L 43/50; H04L 12/2697; H04W 52/42; H04W 52/16; H03G 3/3042
USPC ........................................ 370/252, 254, 253
See application file for complete search history.

(56) References Cited

U.S. PATENT DOCUMENTS

| | | | |
|---|---|---|---|
| 7,974,581 B2 * | 7/2011 | Okada et al. ................... | 455/46 |
| 2007/0155335 A1 | 7/2007 | Love et al. | |

(Continued)

OTHER PUBLICATIONS

"3rd Generation Partnership Project; Technical Specification Group Radio Access Network; User Equipment (UE) radio transmission and reception (FDD) (Release 8)", 3GPP TS 25.101, v8.7.0, May 2009, pp. 1-215.

(Continued)

*Primary Examiner* — Chuong T Ho
(74) *Attorney, Agent, or Firm* — Squire Patton Boggs (US) LLP

(57) ABSTRACT

In accordance with an example embodiment of the present invention, a method is disclosed that comprises receiving at least two sets of gain values, wherein each set of gain values denotes the gains of a set of code channels that are carried by each of at least two carriers; receiving at least two power or amplitude levels that are allocated to the at least two carriers; and calculating a cubic metric based on the received at least two sets of gain values and the received at least two power or amplitude levels.

18 Claims, 4 Drawing Sheets

(56) References Cited

U.S. PATENT DOCUMENTS

| | | | |
|---|---|---|---|
| 2008/0259955 A1* | 10/2008 | Kratochwil et al. | 370/468 |
| 2011/0182197 A1* | 7/2011 | Jones et al. | 370/252 |
| 2013/0044619 A1* | 2/2013 | Wallen et al. | 370/252 |

OTHER PUBLICATIONS

Ventola, "Algorithm and Implementation Specification (AS/IS)", HSUPA Power Control, 3GPP Release 7, v.2.0, Apr. 3, 2009, 57 pages.

International Search Report and Written Opinion received for corresponding Patent Cooperation Treaty Application No. PCT/IB2010/055235, dated Mar. 17, 2011, 13 pages.

"UE Transmitter Characteristics Impact Due to DC-HSUPA", 3GPP TSG-RAN WG4 Meeting #51, Qualcomm Europe, R4-091680, Agenda Item: 7.12, May 4-8, 2009, pp. 1-11.

"Cubic Metric in 3GPP-LTE", 3GPP TSG RAN WG1 LTE Adhoc, Tdoc# R1-060023, Motorola, Jan. 23-26, 2006, pp. 1-7.

Office Action dated Apr. 21, 2014, issued in corresponding Chinese Patent Application No. 201080056087.4.

"Suitable definition of ACLR for DC-HSUPA", 3GPP TSG-RAN WG4 Meeting #51, QUALCOMM Europe, R4-091679, Agenda Item: 7.12, May 4-8, 2009, pp. 1-8.

* cited by examiner

APPARATUS AND METHOD FOR CUBIC METRIC COMPUTATION IN DUAL-CARRIER AND MULTI-CARRIER WIRELESS COMMUNICATION SYSTEM

RELATED APPLICATION

This application was originally filed as Patent Cooperation Treaty Application No. PCT/IB2010/055235 filed Nov. 17, 2010, which claims priority to U.S. Application No. 61/285,333 filed Dec. 10, 2009.

TECHNICAL FIELD

The present application relates generally to an apparatus and a method for cubic metric computation in dual-carrier and multi-carrier wireless communication system.

BACKGROUND

This section is intended to provide a background or context to the invention that is recited in the claims. The description herein may include concepts that could be pursued, but are not necessarily ones that have been previously conceived, implemented or described. Therefore, unless otherwise indicated herein, what is described in this section is not prior art to the description and claims in this application and is not admitted to be prior art by inclusion in this section.

In wireless communication, different collections of communication protocols are available to provide different types of services and capabilities. High speed packet access (HSPA) is one of such collection of wireless communication protocols that extends and improves the performance of existing UMTS (universal mobile telecommunications system) protocols and is specified by different releases of the standard by the $3^{rd}$ generation partnership project (3GPP) in the area of mobile network technology. The other non-limiting example wireless communication protocols are long term evolution (LTE), global system for mobile (GSM) and worldwide interoperability for microwave access (WiMAX).

Current and future networking technologies continue to facilitate ease of information transfer and convenience to users. In order to provide easier or faster information transfer and convenience, telecommunication industry service providers are developing improvements to existing networks. Carrier aggregation technology has drawn considerable attention in, e.g., HSPA and LTE.

In Release 8 (Rel-8) of HSPA standardization of 3GPP, dual-carrier HSDPA (high speed downlink packet access) was specified by introducing dual-carrier operation in the downlink on adjacent carriers. In an example embodiment, dual-carrier HSPA may be used where a MAC (medium access control) scheduler may allocate two HSPA carriers in parallel and double the communication bandwidth. Besides the throughput gain from double the bandwidth, some diversity and joint scheduling gains may also be expected. This can particularly improve the quality of service (QoS) for end users in poor environment conditions that cannot be gained from other techniques Similar idea is under consideration in the enhanced LTE technology called LTE-Advanced. Via this technology LTE is expected to improve end-user throughput, increase sector capacity, reduce user plane latency, and consequently offer superior user experience with full mobility.

In Release 9 studies of the HSPA track, a study item termed DC-HSUPA (dual-cell high speed uplink packet access) for uplink dual carrier UE (user equipment) operation has been launched. In DC-HSUPA, the UE may be assigned one or two adjacent uplink carriers for data transmission if the UE is dual carrier capable. As compared to downlink dual-carrier operation, where the UE is required to receive the dual-carrier transmission transmitted by the Node B or base station, in the uplink the UE is power limited and thus it needs to share its transmission power among the carriers if it transmits on both carriers simultaneously.

SUMMARY

Various aspects of examples of the invention are set out in the claims.

According to a first aspect of the present invention, a method may include receiving at least two sets of gain values, wherein each set of gain values denotes the gains of a set of code channels that are carried by each of at least two carriers, receiving at least two power or amplitude levels that are allocated to the at least two carriers, and calculating a cubic metric based on the received at least two sets of gain values and the received at least two power or amplitude levels.

According to a second aspect of the present invention, an apparatus may include at least one processor, and at least one memory including computer program code, wherein the at least one memory and the computer program code configured to, with the at least one processor, cause the apparatus at least to perform receiving at least two sets of gain values, wherein each set of gain values denotes the gains of a set of code channels that are carried by each of at least two carriers, receiving at least two power or amplitude levels that are allocated to the at least two carriers, and calculating a cubic metric based on the received at least two sets of gain values and the received at least two power or amplitude levels.

According to a third aspect of the present invention, a computer program product comprising a computer-readable medium bearing computer program code embodied therein for use with a computer, the computer program code may include code for receiving at least two sets of gain values, wherein each set of gain values denotes the gains of a set of code channels that are carried by each of at least two carriers, code for receiving at least two power or amplitude levels that are allocated to the at least two carriers, and code for calculating a cubic metric based on the received at least two sets of gain values and the received at least two power or amplitude levels.

According to a fourth aspect of the present invention, an apparatus may include a means for receiving at least two sets of gain values, wherein each set of gain values denotes the gains of a set of code channels that are carried by each of at least two carriers, and receiving at least two power or amplitude levels that are allocated to the at least two carriers. The apparatus may also include a means for calculating a cubic metric based on the received at least two sets of gain values and the received at least two power or amplitude levels.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION

Figure 1:
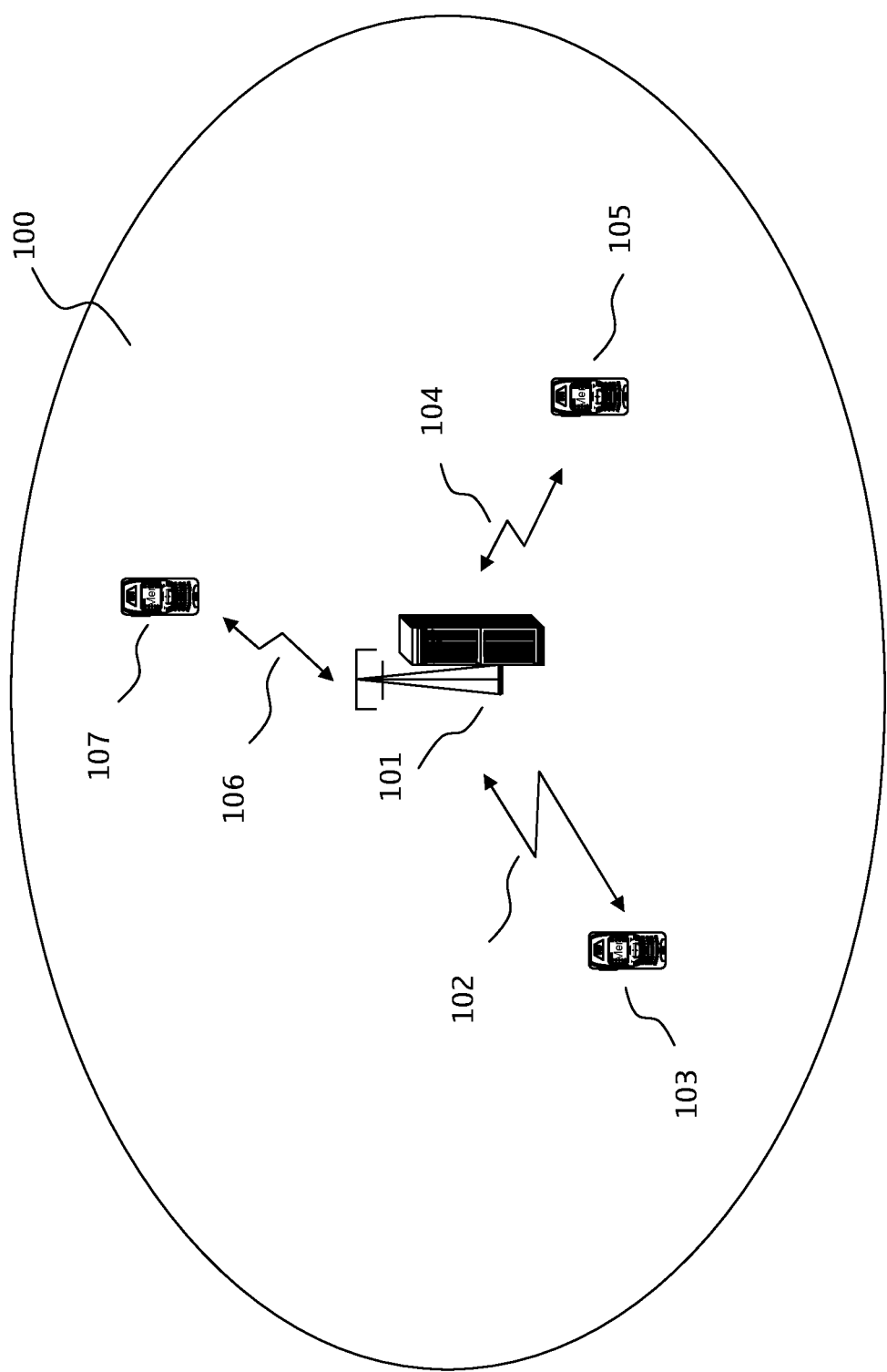
FIG. 1 illustrates an example wireless system.

FIG. 1 depicts an example wireless system 100. Wireless system 100 comprises a Node B or base station 101 and a plurality of user equipments (UEs) 103, 105 and 107. Although just one Node B and three UEs are shown in FIG. 1, the wireless system 100 may comprise more Node Bs and more or less UEs. In one example embodiment, the Node B 101, possibly together with other Node Bs and one or more radio network controllers, comprises the UMTS terrestrial radio access network (UTRAN). In the context of this disclosure, the Node B 101 communicates with the UEs 103, 105 and 107 via bidirectional communication channels or links 102, 104 and 106, respectively. While some of the UEs, for example, the UEs 105 and 107, may be conventional UEs that communicate with the Node B 101 in one carrier frequency or band for each of the downlink and uplink direction, at least one UE, for example, the UE 103, may be allocated dual or multiple carriers for at least its uplink communication channel 102. Therefore, in an example embodiment, the Node B 101 may allocate a communication carrier to each UE, e.g., UE 105 and 107. In an embodiment, the Node B 101 may allocate a plurality of communication carriers to a UE, e.g., UE 103. In such an embodiment, the increase in the number of allocated communication carriers may correlate with an increase in communication bandwidth. A throughput gain from the increase in the bandwidth allocated to a UE may be expected. In an example embodiment, the increased bandwidth, due to the plurality of communication carriers may allow for some diversity and joint scheduling gains.

In an example embodiment, the UE 103 may comprise a BB-IC (baseband integrated circuit) and a RF-IC (radio frequency integrated circuit). For uplink communication, the UE 103 generates in baseband the information signal to be transmitted. The BB-IC, e.g., the block 320 in FIG. 3, which will be described in detail hereinafter, scales the signal to a constant power before it sends the signal to the RF-IC, e.g., the block 200 in FIG. 2 and the block 300 in FIG. 3, which will be described in detail hereinafter.

After digital-to-analog conversion by a digital-to-analog converter (DAC) in the RF-IC, the resultant analog signal is low-pass filtered and modulated by the carrier frequency. Before transmitting the signal to the Node B, the power amplifier (PA) raises the power of the signal to a requested level. The power level may be requested by the BB-IC. In PA circuits the primary cause of adjacent channel leakage is the third order nonlinearity of the amplifier gain characteristic. The RF-IC computes a cubic metric (CM) in order to assess how much the incoming signal would cause the third order non-linearity distortion in the power amplifier. The calculation of the CM is based on beta-values (gain values) delivered by the BB-IC.

For single-carrier HSUPA (high speed uplink packet access), 3GPP TS 25.101 Chapter 6.2.2., incorporated by references herein, sets the requirements for the CM. How the CM is actually computed or estimated is vendor dependent, but the methods have to be based directly or indirectly on the beta-values. When there are more than one carriers with differing power levels, the beta-values in their current form can not any more be used as such to compute the CM, because these beta-values are not commensurate between different carriers. In an example embodiment, these beta-values do not have the same amplitude.

At the interface between the BB-IC and the RF-IC, the baseband signals of both or all carriers arrive at the RF-IC side with about constant and equal power levels due the scaling performed by the BB-IC. The RF-IC does not have knowledge on what kind of scaling has been applied to the signals by the BB-IC. The RF-IC only knows what the signal power levels of the different carriers should be after the power amplification. It also knows what beta-values the BB-IC has delivered.

In accordance with an example embodiment of the invention, the RF-IC applies an adjustment to the beta-values before they are used to compute the CM. The adjustment that the RF-IC applies to the beta-values before they are used to compute the CM, in accordance with an example embodiment, is derived and explained in detail as follows.

The desired behavior of a power amplifier is to amplify the input voltage $v_i(t)$ by a linear gain $G_1$. However, in practical amplifiers there are distortions, caused by for example, the third order nonlinearity of adjacent channel interference. Modeling the third order nonlinearity with the linear gain, the amplifier output voltage is:

$$v_o(t)=G_1 v_i(t)+G_3(v_i(t))^3 \quad (1)$$

Because the gain of the third order nonlinearity $G_3$ is set and fixed by the amplifier design, the third order term $G_3(v_i(t))^3$ is in practice completely determined by $(v_i(t))^3$, which in turn is completely determined by the input signal $v_i(t)$. The 3GPP specifications set the requirements to calculate the cubic metric, which requires the estimation or calculation of $(v_i(t))^3$. To calculate CM, the input voltage signal $v_i(t)$ is normalised to root mean square (rms) value 1.0 and then cubed. The result is then converted to decibels and scaled. However, the variable that is estimated or measured to calculate the cubic metric is $(v_i(t))^3$.

In 3GPP TS25.101, cubic metric is given by $$CM=CEIL\{[20^*\log 10((v\_norm^3)_{rms})-20^*\log 10((v\_norm\_ref^3)_{rms})]/k,0.5\} \quad (2)$$

where CEIL{x, 0.5} means rounding upwards to closest 0.5 dB, v_norm and v_norm_ref are the normalized voltage waveforms of the input signal and the reference signals, respectively, and $20^*\log 10 ((v\_norm\_ref^3)_{rms})$ and k are constants. It follows that CM is a function of $v\_norm^3$. The $v\_norm^3$ in Equation (2) represents the same signal as $(v_i(t))^3$ in Equation (1), when the rms power of $v_i(t)$ is 1.0. The rms power of $v_i(t)$ is assumed to be equal to 1.0 without loss of any generality. That can be assumed because any arbitrary amplitude can be given to the output signal by the amplifier by changing $G_1$ in Equation (1).

In an example embodiment, the CM is estimated by the RF-IC. The input information that is used for estimating the CM in single carrier HSUPA is the beta-values, e.g., the gain values of all the code channels. These beta-values are passed to the RF-IC by the BB-IC. The beta-values of this carrier are denoted by $\beta_1, \beta_2, \ldots, \beta_L$, where L is the number of code channels of the carrier. Therefore, the cubic metric for single carrier signal is a function of $\beta_1, \beta_2, \ldots, \beta_L$, expressed in mathematical terms by the following equation:

$$CM=f(\beta_1, \beta_2, \ldots, \beta_L) \quad (3)$$

In an example embodiment, the exact form of function $f(\ldots)$, or how the actual calculation of the cubic metric is carried out, does not matter. It can be done in any way, but the input information that is used is the set of beta-values $\beta_1, \beta_2, \ldots, \beta_L$, of the carrier. Each code channel produces a certain waveform $s_i(t)$ at the RF-IC after pulse-shape filtering and digital-to-analog conversion among other operations. The signal has also been scaled by the BB-IC to facilitate efficient usage of the BB-IC/RF-IC interface. The input signal of the power amplifier in the RF-IC can be modeled as:

$$v_i(t) = w(\beta_1 s_1(t) + \beta_2 s_2(t) + \ldots + \beta_L s_L(t)) \quad (4)$$

where w denotes the weightings and scalings that have been applied to the sum-signal of the beta-weighted code channels. At the amplifier, the power of the signal is raised to P, which is the transmit power requested by the BB-IC.

In an example embodiment, in the computation of the cubic metric, the amplitude of the signal does not have an effect to the result in the single-carrier system because the cubic metric is not a function of the linear gain, e.g., CM $(v_i(t))$=CM $(\alpha^* v_i(t))$, where $\alpha$ is any arbitrary complex gain. This is because the input voltage is normalized to rms value 1.0 prior to taking the cube.

According to an embodiment, in dual-cell HSUPA, where two adjacent frequency bands are exploited, two baseband signals are added together in the RF-IC prior to amplification. The signals are shifted, for example 5 MHz apart from each other, before summing them into a single signal. The single signal is input to the DAC. The shifting can be achieved, for example, by shifting one signal by −2.5 MHz (denoted by $e^{-j\omega_0 t}$ in Equation (5) below), and the other by +2.5 MHz (denoted $e^{+j\omega_0 t}$ in Equation (5) below). Similarly as in single-carrier HSUPA, the baseband requests the power amplifier to raise the power of the signal to P, which is now $P=P_1+P_2$, where $P_1$ is the power requested for carrier 1 and $P_2$ is the power requested for carrier 2. Because the BB-IC has scaled the signals to such amplitudes that the range of that digital interface is used efficiently, there is no power difference between the signals of the two carriers at the BB-IC/RF-IC interface. Therefore, the baseband informs two power targets to the RF-IC. The RF-IC has no knowledge of what scaling factors have been used to the signals arriving at the RF-IC. However, the RF-IC knows that the final total output power should be $P_1+P_2$ and of that $P_1$ should be the final signal power in carrier 1 and $P_2$ should be the final signal power in carrier 2.

Figure 2:
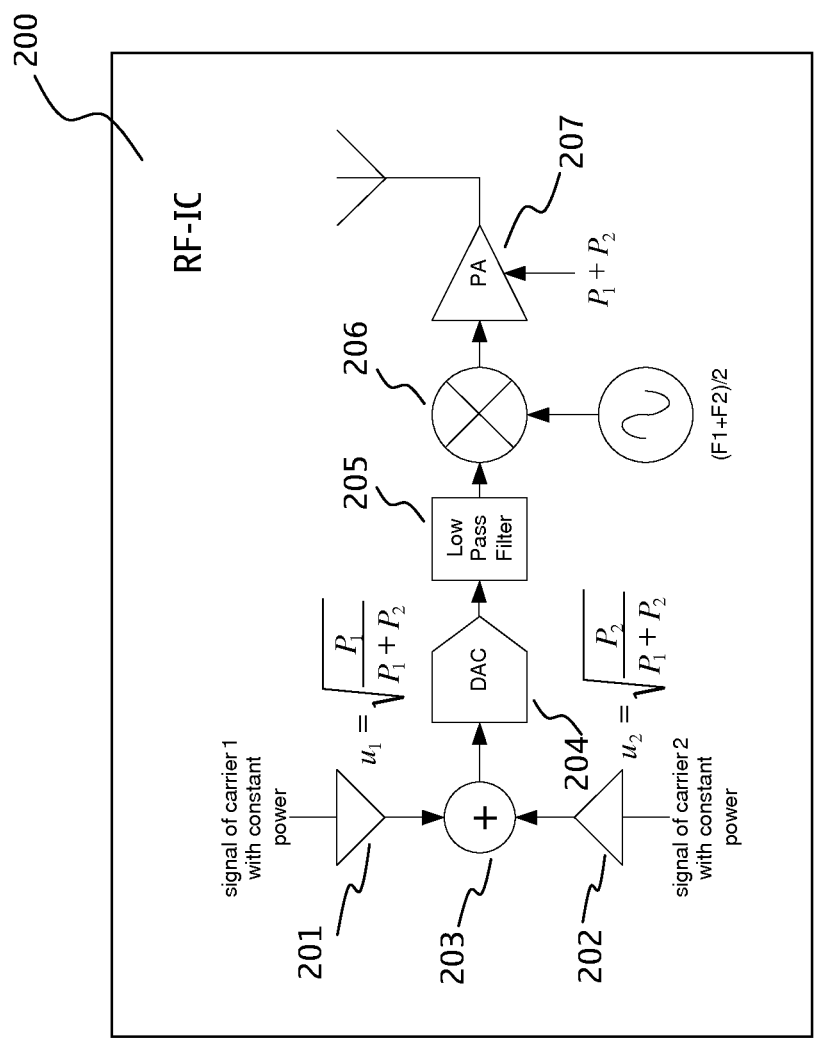
FIG. 2 shows an example RF-IC (radio frequency integrated circuit) for weighting the signals of two carriers to achieve requested power levels.

FIG. 2 illustrates an example RF-IC 200 for weighting the signals of two carriers to achieve requested power levels, according to an example embodiment of the invention. Although the example of FIG. 2 is discussed with reference to two carriers, the teachings can be used for weighting the signal of more than two carriers to achieve requested power levels.

The RF-IC 200 comprises modules for weighting the amplitude of the carrier signals before summing the signals together. In the example of FIG. 2, the amplitude of carrier 1 signal is weighted by $$\sqrt{\frac{P_1}{P_1+P_2}}$$

and the amplitude of carrier 2 signal is weighted by $$\sqrt{\frac{P_2}{P_1+P_2}}$$

before summing the signals together. At modules 201 and 202, the baseband signals of carrier 1 and carrier 2 are weighted by factors $u_1$ and $u_2$, respectively. In the example, $$u_1 = \sqrt{\frac{P_1}{P_1+P_2}} \text{ and } u_2 = \sqrt{\frac{P_2}{P_1+P_2}}.$$

In an example embodiment, the weighting factors $u_1$ and $u_2$ are determined according to the requested power targets $P_1$ and $P_2$ for the two carriers. The weighted baseband signals are summed at the module 203 into one single baseband signal. The resultant single baseband signal is converted to analog waveform at the DAC 204. The RF-IC 200 comprises a low-pass filter 205 to remove the high frequency component in the analog waveform. The modulator 206 modulates the baseband waveform by the desired frequency $(F_1+F_2)/2$, where $F_1$ and $F_2$ are the center carrier frequencies of the two adjacent carriers, respectively. The power amplifier 207 raises the power of the modulated signal to the requested level of the total output power P.

According to an embodiment, the power amplifier input signal for a dual-carrier case $$v_i(t) = w_1 e^{-j\omega_0 t}(\beta_{1,1} s_{1,1}(t) + \beta_{1,2} s_{1,2}(t) + \ldots + \beta_{1,L_1}(t)) + w_2 e^{+j\omega_0 t}(\beta_{2,1} s_{2,1}(t) + \beta_{2,2} s_{2,2}(t) + \ldots + \beta_{2,L_2} s_{2,L_2}(t)) \quad (5)$$

where $w_1$ and $w_2$ contain the weightings that have occurred to the signal prior to summation of them into one signal. They include e.g. the scaling applied by BB-IC prior to BB-IC/RF-IC-interface and the scalings it, and $u_2$ shown in FIG. 2. The RF-IC knows the beta-values for the first carrier $\beta_{1,1}$, $\beta_{1,2}, \ldots, \beta_{1,L_1}$, the beta-values of the second carrier $\beta_{2,1}$, $\beta_{2,2}, \ldots, \beta_{2,L_2}$, as well as the final target powers of the first and second carriers $P_1$ and $P_2$. It can be seen from Equation (5) that the cubic metric is not a function of the beta-values only. In mathematical terms:

$$CM \neq f(\beta_{1,1}, \beta_{1,2}, \ldots, \beta_{1,L_1}, \beta_{2,1}, \beta_{2,2}, \ldots, \beta_{2,L_2}) \quad (6)$$

But instead, the cubic metric is a function of the relative power or amplitude differences between the carriers and the beta-values, thus:

$$CM \neq f(\beta_{1,1}, \beta_{1,2}, \ldots, \beta_{1,L_1}, \beta_{2,1}, \beta_{2,2}, \ldots, \beta_{2,L_2}, P_1, P_2) \quad (7)$$

Because $P=P_1+P_2$, it is derived that:

$$\frac{P_1}{P_2} = \frac{\text{power}(w_1 e^{-j\omega_0 t}(\beta_{1,1} s_{1,1}(t) + \beta_{1,2} s_{1,2}(t) + \ldots + \beta_{1,L_1} s_{1,L_1}(t)))}{\text{power}(w_2 e^{+j\omega_0 t}(\beta_{2,1} s_{2,1}(t) + \beta_{2,2} s_{2,2}(t) + \ldots + \beta_{2,L_2} s_{2,L_2}(t)))} \Leftrightarrow \quad (8)$$

$$\frac{P_1}{P_2} = \frac{w_1^2(\beta_{1,1}^2 + \beta_{1,2}^2 + \ldots + \beta_{1,L_1}^2)}{w_2^2(\beta_{2,1}^2 + \beta_{2,2}^2 + \ldots + \beta_{2,L_2}^2)}$$

It follows that $$\frac{w_2}{w_1} = \frac{\sqrt{P_2}}{\sqrt{P_1}} \frac{\sqrt{(\beta_{1,1}^2 + \beta_{1,2}^2 + \ldots + \beta_{1,L_1}^2)}}{\sqrt{(\beta_{2,1}^2 + \beta_{2,2}^2 + \ldots + \beta_{2,L_2}^2)}} \quad (9)$$

Because CM $(v_i(t))=CM(\alpha^* v_i(t))$, the cubic metric for the input voltage in Equation (5) is the same as for:

$$v_i(t) = e^{-j\omega_0 t}(\beta_{1,1}s_{1,1}(t) + \beta_{1,2}s_{1,2}(t) + \ldots + \beta_{1,L_1}s_{1,L_1}(t)) + \frac{w_2}{w_1}e^{+j\omega_0 t}(\beta_{2,1}s_{2,1}(t) + \beta_{2,2}s_{2,2}(t) + \ldots + \beta_{2,L_2}s_{2,L_2}(t)) \quad (10)$$

Therefore, in order to compute the CM in dual-cell HSUPA based on the beta-values delivered by the BB-IC, the RF-IC performs the following adjustment before or during the computation of the CM:

$$CM = f\left(\beta_{1,1}, \beta_{1,2}, \ldots, \beta_{1,L_1}, \frac{w_2}{w_1}\beta_{2,1}, \frac{w_2}{w_1}\beta_{2,2}, \ldots, \frac{w_2}{w_1}\beta_{2,L_2}\right) \quad (11)$$

$$\text{where } \frac{w_2}{w_1} = \frac{\sqrt{P_2}\sqrt{(\beta_{1,1}^2 + \beta_{1,2}^2 + \ldots + \beta_{1,L_1}^2)}}{\sqrt{P_1}\sqrt{(\beta_{2,1}^2 + \beta_{2,2}^2 + \ldots + \beta_{2,L_2}^2)}} \quad (12)$$

In other words, the CM can be computed based on the beta-values, by adjusting the beta-values with the adjustment shown above. In this example embodiment, the carrier 1 is selected as a reference carrier.

In future deployments of wireless communication networks, e.g., HSPA (high speed packet access) networks, it is expected that more than two carriers (multi-carrier) will be assigned in downlink and/or uplink to further improve the system throughput and user experience.

In another embodiment, the same derivation can be extended to multicarrier-case, where there are more than two carriers that are amplified by the same power amplifier. In an embodiment, if the carrier 1 is selected as the reference carrier, then:

$$\frac{P_1}{P_n} = \frac{\text{power}(w_1 e^{-j\omega_0 t}(\beta_{1,1}s_{1,1}(t) + \beta_{1,2}s_{1,2}(t) + \ldots + \beta_{1,L_1}s_{1,L_1}(t)))}{\text{power}(w_n e^{+j\omega_0 t}(\beta_{n,1}s_{n,1}(t) + \beta_{n,2}s_{n,2}(t) + \ldots + \beta_{n,L_n}s_{n,L_n}(t)))} \quad (13)$$

$$\Leftrightarrow \frac{P_1}{P_n} = \frac{w_1^2(\beta_{1,1}^2 + \beta_{1,2}^2 + \ldots + \beta_{1,L_1}^2)}{w_n^2(\beta_{n,1}^2 + \beta_{n,2}^2 + \ldots + \beta_{n,L_n}^2)}$$

$$\Leftrightarrow \quad (14)$$

$$\frac{w_n}{w_1} = \frac{\sqrt{P_n}\sqrt{(\beta_{1,1}^2 + \beta_{1,2}^2 + \ldots + \beta_{1,L_1}^2)}}{\sqrt{P_1}\sqrt{(\beta_{n,1}^2 + \beta_{n,2}^2 + \ldots + \beta_{n,L_n}^2)}}$$

where n indicates the carrier index.

Figure 3:
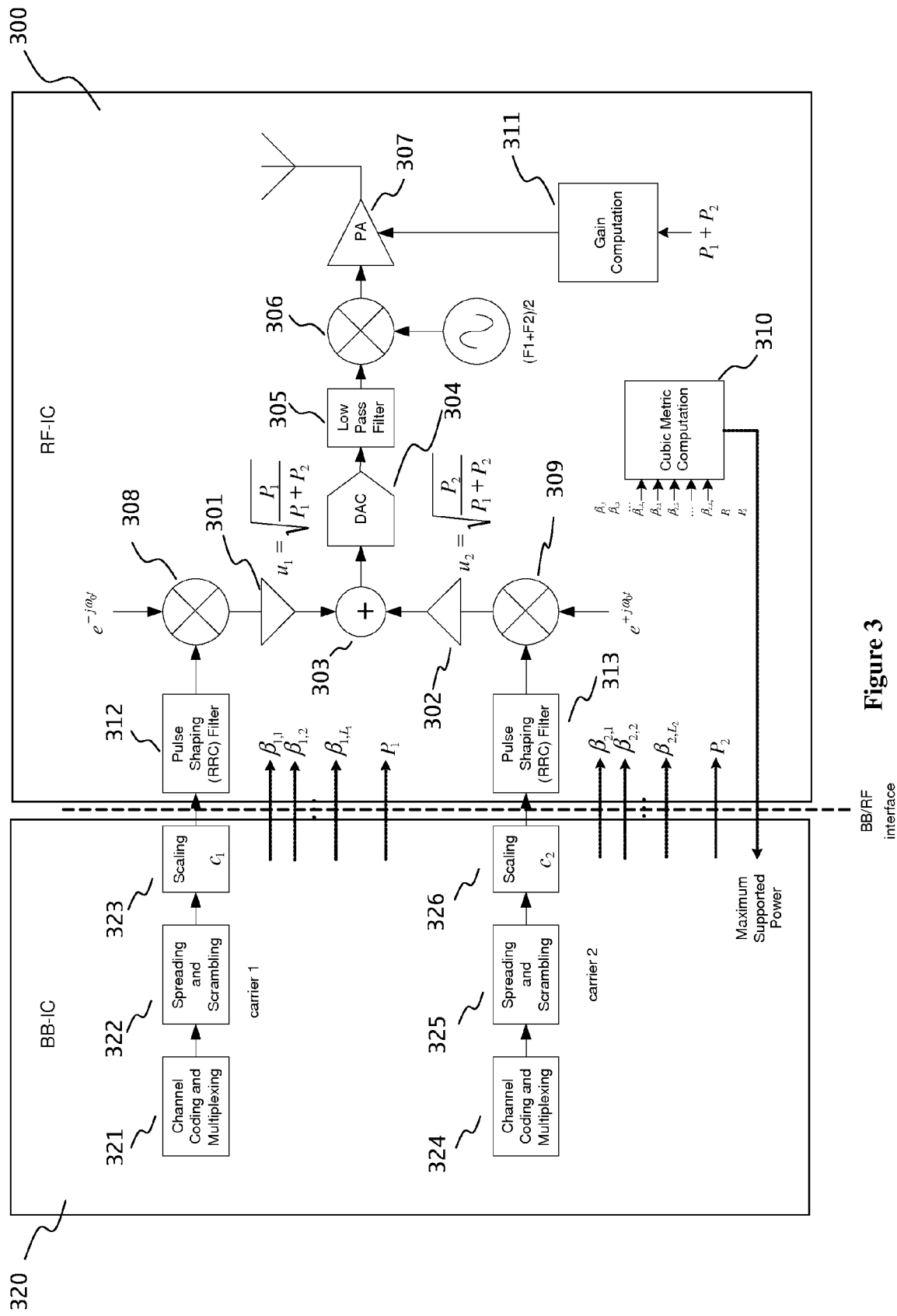
FIG. 3 shows an example BB-IC (baseband integrated circuit) and an example RF-IC that are suitable for cubic metric computation in accordance with an example embodiment of the invention.

FIG. 3 depicts an example BB-IC and an example RF-IC that are suitable for cubic metric computation in accordance with an example embodiment of the invention. In FIG. 3, dual carrier deployment is assumed for the purposes of describing the example embodiments of this invention. The teachings of FIG. 3 can be used when there are more than two carriers.

In the example of FIG. 3, the baseband IC 320 includes two data flow branches. The information transmitted through the two data flow branches is generated inside the BB-IC, or may be provided by other entity to the BB-IC. Channel coding and multiplexing is applied to the information of each branch to generate baseband signals by modules 321 and 324, respectively. Each of the data flow branches also comprises a module, 322 and 325, for applying spreading and scrambling operation on the baseband signals when it is applicable, for example, in a HSPA system.

The baseband signals from modules 322 and 325 are scaled to constant amplitude or power level at blocks 323 and 326, respectively, before they are provided to the RF-IC 300.

In an example embodiment, the BB-IC is responsible for providing the sets of beta-values or gain values, one for each of the carriers, and the requested power targets, for example $P_1$ and $P_2$, to the RF-IC through the BB/RF interface in order to compute the cubic metric.

In the example of FIG. 3, the RF-IC 300 comprises a pulse shaping filter which is applied on each of the baseband input to control intersymbol interference, 312 and 313. The two baseband signals are then shifted a certain amount of frequency distance, for example, 5 MHz, apart from each other at blocks 308 and 309, respectively. As in FIG. 2, the RF-IC 300 in FIG. 3 comprises modules for weighting the amplitude of carrier 1 signal by $$\sqrt{\frac{P_1}{P_1 + P_2}}$$

and the amplitude of carrier 2 signal by $$\sqrt{\frac{P_2}{P_1 + P_2}}$$

before summing the signals together. At modules 301 and 302, the baseband signals of carrier 1 and carrier 2 are weighted by factors $u_1$ and $u_2$, respectively, where $$u_1 = \sqrt{\frac{P_1}{P_1 + P_2}} \text{ and } u_2 = \sqrt{\frac{P_2}{P_1 + P_2}}.$$

The weighting factors $u_1$ and $u_2$ are determined according to the requested power targets $P_1$ and $P_2$ for the two carriers. In case of more than two carriers, the weighting factor $u_n$ of the n-th carrier is given by $$u_n = \sqrt{\frac{P_n}{\sum_{k=1}^{K} P_k}},$$

where K is the number of carriers.

The weighted baseband signals are summed at the module 303 and the resulting single baseband sigal is converted to analog waveform at the DAC 304. The RF-IC may comprise a low-pass filter 305, which is applied to the analog waveform to remove the high frequency component in the analog waveform. The modulator 306 modulates the baseband waveform by the desired frequency, for example $(F_1+F_2)/2$, where $F_1$ and $F_2$ are the center carrier frequencies of the adjacent carriers. In case of more than two carriers, the desired frequency is given by $$\sum_{k=1}^{K} F_k / K,$$

where K is the number of carriers. The PA 307 raises the power of the modulated signal to the requested level P.

In accordance with an example embodiment of this disclosure, the RF-IC of FIG. 3 comprises a module for cubic metric computation 310. The two sets of beta-values and the request power targets $P_1$ and $P_2$ are provided to module 310. In an example embodiment, module 310 performs the computation according to Equation (7). In an alternative embodiment, the module 310 computes the CM based on Equations (11) and (12) illustrated above.

In an example embodiment, the module 310 does not send the computed CM directly back to the BB-IC. Instead, the module 310 calculates the maximum power reduction (MPR) as a function of CM and provides the MRP to BB-IC.

In an alternative embodiment, the module 310 directly provides the computed CM to BB-IC. In another example embodiment, other metric, for example, the maximum supported power, may be calculated and provided to BB-IC by the module 310.

Figure 4:
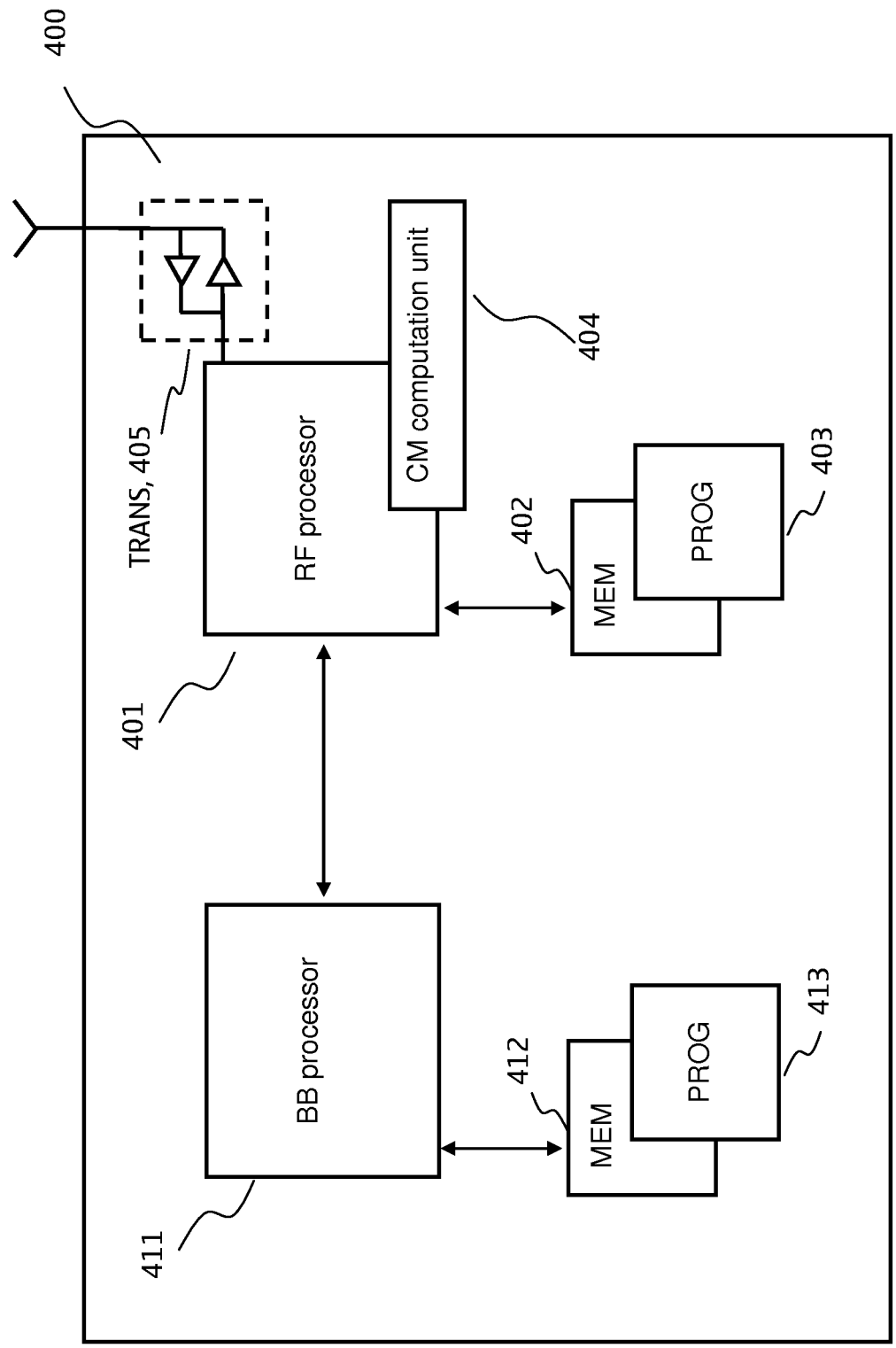
FIG. 4 shows a simplied block diagram of an electronic apparatus in accordance with an example embodiment of the invention.

Reference is made to FIG. 4 for illustrating a simplified block diagram of an electronic apparatus 400 that is suitable for use in practicing the example embodiments of this disclosure. In an example embodiment, the apparatus may be a mobile communication device which may be referred to as the UE 103. The apparatus 400 includes a baseband processor 411 and a memory (MEM) 412 coupled to the baseband processor 411 that stores a program of computer instructions (PROG) 413. The PROG 413 causes the baseband processor 411 to perform similar functions as what the BB-IC 320 does in FIG. 3. The apparatus 400 also includes a RF processor 401 and a MEM 402 coupled to the RF processor 401 that stores a program of computer instruction 403. The apparatus 400 may further include a suitable transceiver (TRANS) 405 (having a transmitter (TX) and a receiver (RX)) coupled to the RF processor 401. The TRANS 405 is for bidirectional wireless communications with other communication devices that are not shown in FIG. 4.

As shown in FIG. 4, the apparatus 400 may further include a cubic metric computation unit 404, which is provided more than one set of beta-values and the requested power targets. The CM computation unit 404, together with the RF processor 401 and the PROG 403, is configured to perform the computation of the cubic metric in a similar way as the cubic metric computation module 310 of FIG. 3. In an example embodiment, the CM computation unit 404 is a part of the RF processor 401.

At least one of the PROGs 403, 413 is assumed to include program instructions that, when executed by the associated processor, enable the electronic apparatus to operate in accordance with the example embodiments of this disclosure, as discussed herein.

In general, the various example embodiments of the apparatus 400 can include, but are not limited to, cellular phones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The example embodiments of this disclosure may be implemented by computer software executable by one or more of the processors 401 and 411 of the apparatus 400, or by hardware, or by a combination of software and hardware. In an example embodiment, the processors 401 and 411 may be implemented in a single integrated circuit.

The MEMs 402 and 412 may be of any type suitable to the local technical environment and may be implemented using any suitable data storage technology, such as semiconductor-based memory devices, flash memory, magnetic memory devices and systems, optical memory devices and systems, fixed memory and removable memory, as non-limiting examples. In an example embodiment, the MEMs 402 and 412 may be implemented in a single entity. The processors 401 and 411 may be of any type suitable to the local technical environment, and may include one or more of general purpose computers, special purpose computers, microprocessors, digital signal processors (DSPs) and processors based on multi-core processor architecture, as non-limiting examples.

Without in any way limiting the scope, interpretation, or application of the claims appearing below, a technical effect of one or more of the example embodiments disclosed herein may be allowing the cubic metric to be computed accurately for dual-carrier and multiple-carrier communication devices. This allows the baseband IC to determine the correct transmit power level and reduce the non-linearity distortion in the power amplifier.

Embodiments of the present invention may be implemented in software, hardware, application logic or a combination of software, hardware and application logic. The software, application logic and/or hardware may reside on an apparatus such as a user equipment, a Node B/base station 301 or other mobile communication devices. If desired, part of the software, application logic and/or hardware may reside on a BB-IC 320, part of the software, application logic and/or hardware may reside on a RF-IC 300, and part of the software, application logic and/or hardware may reside on other chipset or integrated circuit. In an example embodiment, the application logic, software or an instruction set is maintained on any one of various conventional computer-readable media. In the context of this document, a "computer-readable medium" may be any media or means that can contain, store, communicate, propagate or transport the instructions for use by or in connection with an instruction execution system, apparatus, or device. A computer-readable medium may comprise a computer-readable storage medium that may be any media or means that can contain or store the instructions for use by or in connection with an instruction execution system, apparatus, or device.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

For example, while the example embodiments have been described above in the context of the HSUPA system for uplink transmission, it should be appreciated that the example embodiments of this invention are not limited for use with only this one particular type of wireless communication system, and that they may be used to advantage in other wireless communication systems and in downlink transmission. Although two adjacent carriers are assumed in FIGS. 2 and 3 for illustration purpose, the example embodiments of this invention are also suitable for use with more than two carriers and/or with non-adjacent carriers.

Further, the various names used for the described parameters are not intended to be limiting in any respect, as these parameters may be identified by any suitable names. Further, the various names assigned to different channels (e.g., beta-values, etc.) are not intended to be limiting in any respect, as these various channels may be identified by any suitable names.

If desired, the different functions discussed herein may be performed in a different order and/or concurrently with each other. Furthermore, if desired, one or more of the above-described functions may be optional or may be combined. As such, the foregoing description should be considered as merely illustrative of the principles, teachings and example embodiments of this invention, and not in limitation thereof.

What is claimed is:

1. A method, comprising:
receiving, at a radio frequency integrated circuit, at least two sets of gain values, wherein each set of gain values denotes the gains of a set of code channels that are carried by a carrier of at least two carriers;
receiving, at the radio frequency integrated circuit, at least two power levels, each of the at least two power levels being allocated to a different carrier of the at least two carriers;
calculating, at the radio frequency integrated circuit, a cubic metric based on the received at least two sets of gain values and the received at least two power levels signaling the cubic metric, or a value derived from the cubic metric, to a baseband integrated circuit, in order to determine a correct transmit power level to reduce non-linearity distortion.

2. The method of claim 1, wherein calculating the cubic metric further comprises:
selecting at least one of the at least two carriers as a reference carrier; and
based on the selection, adjusting at least one of the at least two sets of gain values by a parameter that is derived from the received at least two sets of gain values and the received at least two power levels.

3. The method of claim 2, wherein the parameter is equal to $$\frac{\sqrt{P_n}}{\sqrt{P_1}} \frac{\sqrt{(\beta_{1,1}^2 + \beta_{1,2}^2 + \ldots + \beta_{1,L_1}^2)}}{\sqrt{(\beta_{n,1}^2 + \beta_{n,2}^2 + \ldots + \beta_{n,L_n}^2)}},$$

wherein n is the index of the carrier that carries the set of code channels whose gain values $(\beta_{n,1}, \beta_{n,2}, \ldots, \beta_{n,L_n})$ are to be adjusted, $L_n$ is the number of the code channels carried by the carrier n, $(\beta_{1,1}, \beta_{1,2}, \ldots, \beta_{1,L_1})$ are the gain values of the code channels carried by the referenced carrier, $L_1$ is the number of the code channels of the referenced carrier, $P_n$ is the power level allocated to the carrier n, and $P_1$ is the power level allocated to the referenced carrier.

4. The method of claim 1, further comprising:
scaling, at the radio frequency integrated circuit, the signal of carrier n by $$\sqrt{\frac{P_n}{\sum_{k=1}^{K} P_k}},$$

where $P_n$ is the power level allocated to the carrier n and K is the number of carriers.

5. An apparatus, comprising:
at least one processor; and
at least one memory including computer program code,
wherein the at least one memory and the computer program code are configured to, with the at least one processor, cause the apparatus at least to
receive at least two sets of gain values, wherein each set of gain values denotes the gains of a set of code channels that are carried by each of at least two carriers,
receive at least two power levels that are allocated to the at least two carriers, and
calculate a cubic metric based on the received at least two sets of gain values and the received at least two power levels, in order to determine a correct transmit power level to reduce non-linearity distortion.

6. The apparatus of claim 5, wherein the at least one memory and the computer program code are configured to, with the at least one processor, cause the apparatus at least to further
select at least one of the at least two carriers as the referenced carrier; and
based on the selection, adjusting at least one of the at least two sets of gain values by a parameter that is derived from the received at least two sets of gain values and the received at least two power levels.

7. The apparatus of claim 6, wherein the parameter is equal to $$\frac{\sqrt{P_n}}{\sqrt{P_1}} \frac{\sqrt{(\beta_{1,1}^2 + \beta_{1,2}^2 + \ldots + \beta_{1,L_1}^2)}}{\sqrt{(\beta_{n,1}^2 + \beta_{n,2}^2 + \ldots + \beta_{n,L_n}^2)}},$$

wherein n is the index of the carrier that carries the set of code channels whose gain values $(\beta_{n,1}, \beta_{n,2}, \ldots, \beta_{n,L_n})$ are to be adjusted, $L_n$ is the number of the code channels carried by the carrier n, $(\beta_{1,1}, \beta_{1,2}, \ldots, \beta_{1,L_1})$ are the gain values of the code channels carried by the referenced carrier, $L_1$ is the number of the code channels of the referenced carrier, $P_n$ is the power level allocated to the carrier n, and $P_1$ is the power level allocated to the referenced carrier.

8. The apparatus of claim 5, wherein the apparatus is a radio frequency integrated circuit further comprising:
a digital-to-analog converter, a low pass filter and a power amplifier.

9. The apparatus of claim 5, wherein the apparatus is a user terminal further comprising:
a baseband integrated circuit and baseband software configured to provide the at least two sets of gain values and the at least two power levels.

10. The apparatus of claim 5, wherein the at least one memory and the computer program code are configured to, with the at least one processor, cause the apparatus at least to further
scale the signal of carrier n by $$\sqrt{\frac{P_n}{\sum_{k=1}^{K} P_k}},$$

where $P_n$ is the power level allocated to the carrier n and K is the number of carriers.

11. A computer program embodied on a non-transitory computer readable medium, the computer program, when executed by a processor, causes the processor to:
- receive at least two sets of gain values, wherein each set of gain values denotes the gains of a set of code channels that are carried by each of at least two carriers;
- receive at least two power levels that are allocated to the at least two carriers; and
- calculate a cubic metric based on the received at least two sets of gain values and the received at least two power levels, in order to determine a correct transmit power level to reduce non-linearity distortion.

12. The computer program embodied on the non-transitory computer readable medium of claim 11, wherein the computer program, when executed by the processor, further causes the processor to:
- select at least one of the at least two carriers as the referenced carrier; and
- adjust, based on the selection, at least one of the at least two sets of gain values by a parameter that is derived from the received at least two sets of gain values and the received at least two power levels.

13. The computer program embodied on the non-transitory computer readable medium of claim 12, wherein the parameter is equal to $$\frac{\sqrt{P_n}\sqrt{(\beta_{1,1}^2+\beta_{1,2}^2+\ldots+\beta_{1,L_1}^2)}}{\sqrt{P_1}\sqrt{(\beta_{n,1}^2+\beta_{n,2}^2+\ldots+\beta_{n,L_n}^2)}},$$

wherein n is the index of the carrier that carries the set of code channels whose gain values $(\beta_{n,1}, \beta_{n,2}, \ldots, \beta_{n,L_n})$ are to be adjusted, $L_n$ is the number of the code channels carried by the carrier n, $(\beta_{1,1}, \beta_{1,2}, \ldots, \beta_{1,L_1})$ are the gain values of the code channels carried by the referenced carrier, $L_1$ is the number of the code channels of the referenced carrier, $P_n$ is the power level allocated to the carrier n, and $P_1$ is the power level allocated to the referenced carrier.

14. The computer program embodied on the non-transitory computer readable medium of claim 12, wherein the computer program, when executed by the processor, further causes the processor to:
- scale the signal of carrier n by $$\sqrt{\frac{P_n}{\sum_{k=1}^{K} P_k}},$$

where $P_n$ is the power level allocated to the carrier n and K is the number of carriers.

15. An apparatus, comprising: means for receiving at least two sets of gain values, wherein each set of gain values denotes the gains of a set of code channels that are carried by each of at least two carriers;
- means for receiving at least two power levels that are allocated to the at least two carriers; and
- means for calculating a cubic metric based on the received at least two sets of gain values and the received at least two power levels, in order to determine a correct transmit power level to reduce non-linearity distortion.

16. The apparatus of claim 15, further comprising:
- means for selecting at least one of the at least two carriers as the referenced carrier; and
- means for adjusting, based on the selection, at least one of the at least two sets of gain values by a parameter that is derived from the received at least two sets of gain values and the received at least two power levels.

17. The apparatus of claim 16, wherein the parameter is equal to $$\frac{\sqrt{P_n}\sqrt{(\beta_{1,1}^2+\beta_{1,2}^2+\ldots+\beta_{1,L_1}^2)}}{\sqrt{P_1}\sqrt{(\beta_{n,1}^2+\beta_{n,2}^2+\ldots+\beta_{n,L_n}^2)}},$$

wherein n is the index of the carrier that carries the set of code channels whose gain values $(\beta_{n,1}, \beta_{n,2}, \ldots, \beta_{n,L_n})$ are to be adjusted, $L_n$ is the number of the code channels carried by the carrier n, $(\beta_{1,1}, \beta_{1,2}, \ldots, \beta_{1,L_1})$ are the gain values of the code channels carried by the referenced carrier, $L_1$ is the number of the code channels of the referenced carrier, $P_n$ is the power level allocated to the carrier n, and $P_1$ is the power level allocated to the referenced carrier.

18. The apparatus of claim 15, further comprising:
- means for scaling the signal of carrier n by $$\sqrt{\frac{P_n}{\sum_{k=1}^{K} P_k}},$$

where $P_n$ is the power level allocated to the carrier n and K is the number of carriers.

\* \* \* \* \*